(12) United States Patent
Butzmann

(10) Patent No.: US 9,935,537 B2
(45) Date of Patent: Apr. 3, 2018

(54) INVERTER CIRCUIT WITH VOLTAGE LIMITATION

(71) Applicant: Robert Bosch GmbH, Stuttgart (DE)

(72) Inventor: Stefan Butzmann, Schalksmühle (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 15/025,601

(22) PCT Filed: Sep. 8, 2014

(86) PCT No.: PCT/EP2014/069061
§ 371 (c)(1),
(2) Date: Mar. 29, 2016

(87) PCT Pub. No.: WO2015/043936
PCT Pub. Date: Apr. 2, 2015

(65) Prior Publication Data
US 2016/0241129 A1    Aug. 18, 2016

(30) Foreign Application Priority Data
Sep. 30, 2013  (DE) .................. 10 2013 219 670

(51) Int. Cl.
*H02M 1/32*  (2007.01)
*H03K 17/082*  (2006.01)
(Continued)

(52) U.S. Cl.
CPC ............. *H02M 1/32* (2013.01); *H02M 7/537* (2013.01); *H03K 17/0822* (2013.01);
(Continued)

(58) Field of Classification Search
CPC .... H02M 1/32; H02M 7/537; H03K 17/0822; H03K 17/14; H03K 17/74; H03K 17/165; H03K 17/30
See application file for complete search history.

(56) References Cited

U.S. PATENT DOCUMENTS

| 4,594,650 A | 6/1986 | Kinbara |
| 6,373,731 B1 * | 4/2002 | Iwamura .................. H02M 1/34 361/91.1 |

(Continued)

FOREIGN PATENT DOCUMENTS

| DE | 3415011 | 10/1984 |
| DE | 602004004669 | 11/2007 |

(Continued)

OTHER PUBLICATIONS

International Search Report for Application No. PCT/EP2014/069061 dated Feb. 6, 2015 (English Translation, 4 pages).

*Primary Examiner* — Jue Zhang
(74) *Attorney, Agent, or Firm* — Michael Best & Friedrich LLP

(57) ABSTRACT

The invention relates to an inverter circuit (80) which comprises first and second switching means (1, 2) that are connected, in an electrical path (10), in series to one another and parallel to a DC link capacitor (20). Said inverter circuit (80) also comprises an output (9) and two inputs (11, 12) which are each electrically-conductively connected to a pole of the DC link capacitor (20) and can each be connected to a pole of an energy store. Said inverter circuit (80) also comprises a voltage limitation element (30) which is electrically-conductively connected to the electrical path (10) by a first connection between the two switching means (1, 2), and to the control connection (3) of the second switching means (2) by a second connection. According to the invention, a capacitor (40) is arranged in said electrically-conductive connection between the voltage limitation element (30) and the control connection (3) of the second switching means (2), and a reference voltage source (50) is electrically-conductively connected to the first connection of said voltage limitation element (30).

10 Claims, 4 Drawing Sheets

(51) Int. Cl.
*H03K 17/14* (2006.01)
*H03K 17/16* (2006.01)
*H03K 17/30* (2006.01)
*H03K 17/74* (2006.01)
*H02M 7/537* (2006.01)

(52) U.S. Cl.
CPC ........... H03K 17/14 (2013.01); H03K 17/165 (2013.01); H03K 17/30 (2013.01); H03K 17/74 (2013.01)

(56) References Cited

U.S. PATENT DOCUMENTS

| | | | |
|---|---|---|---|
| 8,213,146 B2 * | 7/2012 | Katoh | H03K 17/0828 361/91.5 |
| 2011/0215840 A1 * | 9/2011 | Machida | H03K 3/00 327/109 |
| 2012/0019174 A1 | 1/2012 | Mahlein et al. | |

FOREIGN PATENT DOCUMENTS

| | | | |
|---|---|---|---|
| DE | 102009014704 | 10/2010 | |
| EP | 0730331 | 9/1996 | |
| EP | 0730331 A2 * | 9/1996 | ........... H07H 7/1225 |

* cited by examiner

INVERTER CIRCUIT WITH VOLTAGE LIMITATION

BACKGROUND OF THE INVENTION

The present invention relates to an inverter circuit which comprises a first and a second switching means which are connected, in an electrical path, in series to one another and parallel to a DC link capacitor and the control connections of which are each connected to a pulse control device. The inverter circuit also comprises an output and two inputs, which are each electrically-conductively connected to a pole of the DC link capacitor and can each be connected to a pole of an energy store, as well as a voltage limitation element which is electrically-conductively connected to the electrical path by a first connection between the two switching means and to the control connection of the second switching means by a second connection.

Inverter circuits, also simply referred to as inverters or alternating-current converters, are one of the most important constituents in electrical drives, in particular in electrical drives which are supplied with a DC voltage. In the German patent publication DE 3415011 A1, such an inverter circuit is denoted/disclosed there as an inverter device. More precisely stated, an inverter device comprising semiconductor current control elements is described in said German patent publication DE 3415011 A1. In said inverter circuit, a parallel circuit comprising a current limiting circuit and a diode is connected in series to each of the semiconductor current control elements in order to prevent an excessive current from flowing through the same.

The German patent publication DE 10 2009 014 704 A1 furthermore discloses a drive system and a method for operating a drive system, which comprises an electric motor, a power inverter and an energy store, wherein the electric motor can be supplied by the power inverter and wherein a controllable current from a switch can be supplied to at least one stator winding of the electric motor, said current being supplied from an electrical energy source that is different from the energy store.

In addition, the German patent publication DE 60 2004 004 669 T2 relates to a control device for a multi-phase and reversible starter generator which is connected to a battery and an on-board power supply and, on the one hand, comprises a bridge having switches in the form of power transistors and, on the other hand, an electronic control and monitoring unit comprising actuating devices for actuating the gates of the power transistors. FIG. 1 shows a further inverter circuit 80 of the prior art in a state, where said inverter circuit is connected to an energy store 90 and a load 100. The inverter circuit 80 comprises a first and a second switching means 1, 2 which are connected, in an electrical path 10, in series to one another and parallel to a DC link capacitor 20 and the control connections 3 of which are each connected to a pulse control device 5, which, in this example, of an inverter circuit 80 of the prior art is only depicted for the lower, second switching means 2. The inverter circuit 80 also comprises an output 9, which, in this example, is electrically-conductively connected to the electrical path 10 between the first and the second switching means 1, 2, and two inputs 11, 12 which are each electrically-conductively connected to a pole of the DC link capacitor 20 and in each case to a pole of an energy store 90. The inverter circuit of the prior art furthermore comprises a voltage limitation element 30 which is electrically-conductively connected to the electrical path 10 by a first connection thereof between the two switching means 1, 2 and to the control connection 3 of the second switching means 2 by a second connection thereof. In this example, the voltage limitation element 30 is designed as a Zener diode 30.

The voltage limitation element 30 is used to break down voltage spikes occurring at the output 9, i.e. between the first and the second switching means 1, 2 in the electrical path 10. If a voltage spike occurs at the output 9 or, respectively, between the first and the second switching means 1, 2 in the electrical path 10, for example due to an interrupted current flow in the load 100, the second switching means 2 is then actuated when the breakdown voltage of the Zener diode has been exceeded in order to facilitate a certain current flow and to break down the voltage spike. A control circuit 70 is additionally located in the inverter circuit 80, said control circuit limiting the voltage at the output 9 via an intervention at the control connection 3 of the second switching means 2. The dynamics of such an intervention are, however, small and cannot correct short surge voltage spikes. It is furthermore a problem with the inverter circuit 80 depicted in FIG. 1 that the voltage at the output 9 or, respectively, between the first and second switching means 1, 2 in the electrical path 10 can drift with increasing age when temperature fluctuations occur and due to the tolerances of the components. Hence, a variation around +/−50 V is, for example, possible at a design voltage of 400 V. The voltage applied to the DC link capacitor 20 can therefore also be greater than the design voltage, according to which the DC link capacitor 20 as well as the other components have to be dimensioned.

SUMMARY OF THE INVENTION

The invention relates to an inverter circuit that comprises a first and a second switching means which are connected, in an electrical path, in series to one another and parallel to a DC link capacitor and the control connections of which are each connected to a pulse control device. The inverter circuit furthermore comprises an output and two inputs which are each electrically-conductively connected to a pole of the DC link capacitor and can each be connected to a pole of an energy store. Said inverter circuit also comprises a voltage limitation element which is electrically-conductively connected to the electrical path by a first connection between the two switching means and to the control connection of the second switching means by a second connection. According to the invention, a capacitor is arranged in said electrically-conductive connection between the voltage limitation element and the control connection of the second switching means; and a reference voltage source is electrically-conductively connected to the first connection of said voltage limitation element.

The advantage of an inverter circuit designed in such a manner is that said inverter circuit provides the basis for a fast and very precise degradation of voltage spikes occurring in the electrical path between the first and the second switching means. In an inverter circuit designed according to the invention, DC link capacitors or, respectively, circuit components which are dimensioned smaller in comparison to the inverter circuits of the prior art can therefore be used because voltage surges are immediately degraded.

In addition, the inverter circuit preferably comprises a first diode, which is arranged in the electrically-conductive connection between the first connection of the voltage limitation element and the electrical path. The cathode of the first diode is furthermore preferably electrically-conductively connected to the first connection of the voltage limitation element, whereas the anode of the first diode is electrically-conductively connected to the electrical path. In such an exemplary embodiment, the first diode prevents the reference voltage provided by the reference voltage source from being further transmitted.

In a preferable manner, the inverter circuit further comprises a second diode, which is arranged in the electrically-conductive connection between the reference voltage source and the first connection of the voltage limitation element. The cathode of the second diode is preferably electrically-conductively connected to the first connection of the voltage limitation element, whereas the anode of the second diode is electrically-conductively connected to the reference voltage source. In such an exemplary embodiment, the second diode ensures that a current does not flow back into the reference voltage source at any point in time. This increases the reliability and safety as well as the stability of the inverter circuit.

In a preferred embodiment, the following equation: Ur=Uc+Uspb applies to the reference voltage Ur which is provided by the reference voltage source, wherein Uc corresponds to the voltage at the capacitor in the fully charged state and Uspb corresponds to the breakdown voltage of the voltage limitation element. Expressed in other words, the reference voltage Ur which can be provided by the reference voltage source is set or, respectively, selected in such a way that the voltage dropping across the voltage limitation element in the fully charged state of the capacitor is exactly equal to the breakdown voltage of the voltage limitation element Uspb. The advantage of such an embodiment of the inverter circuit is that an ageing of the voltage limitation element as well as change in the breakdown voltage required for a breakdown of the voltage limitation element, which change is, for example caused by the ageing of said voltage limitation element, have no effect on the reliable degradation of the voltage spikes occurring in the electrical path between the first and the second switching means. Tolerances of the components installed in the inverter circuit also do not affect the functionality of the circuit as defined above.

The voltage limitation element is preferably designed as a Zener diode. Voltages can be very accurately limited to a previously defined value by means of a Zener diode.

In a preferred embodiment, the inverter circuit further comprises a control circuit which has an input and an output electrically-conductively connected to the control connection of the second switching means, wherein the input of the control circuit is electrically-conductively connected to the electrically-conductive connection between the electrical path and the first connection of the voltage limitation element. In addition, the input of the control circuit is preferably directly connected to the electrical path in an electrically-conductive manner. While a very fast and precise voltage spike limitation is achieved by the combination consisting of voltage limitation element, reference voltage source and capacitor, a control circuit facilitates a slow adaptation or, respectively, limitation of the current.

In a preferred modification to the embodiment, the input of the control circuit is electrically-conductively connected to a voltage divider circuit formed by two resistors connected in series to one another. By means of such a voltage divider circuit, a total voltage applied to the voltage divider circuit can be broken down to a desired partial voltage as a result of appropriately selecting the resistance values of the first and second resistor of the voltage divider circuit.

The control circuit preferably comprises a feedback operational amplifier, the output of which is electrically-conductively connected to the output of the control circuit and the non-inverting input of which is electrically-conductively connected to the voltage divider circuit between the resistors of said voltage divider circuit. An additional capacitor is also arranged in the feedback branch of said feedback operational amplifier. In such an exemplary embodiment, the voltage at the non-inverting input of the operational amplifier is reduced by the factor $R_2/(R_1+R_2)$, $R_1$ being the resistance value of the first resistor of the voltage divider circuit and $R_2$ being the resistance value of the second resistor of the voltage divider circuit. Having a capacitor in the feedback branch, the control circuit functions as an integrator circuit or, respectively, as an integrating amplifier.

The inverting input of the feedback operational amplifier is preferably electrically-conductively connected to a pole of a further voltage source. The further voltage source sets the inverting input of the operational amplifier to a predetermined potential in order to adjust the control circuit or, respectively, the feedback operational amplifier to voltage spikes to be degraded.

The output of the control circuit is preferably electrically-conductively connected to the control connection of the second switching means via a Darlington circuit. The advantage of such a Darlington circuit is that a significantly higher current amplification can be achieved or, respectively, the required control currents are, in any event, lower with the use of said Darlington circuit when the space requirements remain the same.

The regulator voltage $U_{regler}$—the control circuit inducing an opening of the second switching means upon said regulator voltage being applied to the input of said control circuit—has a smaller magnitude than the reference voltage Ur provided by the reference voltage source. In such an exemplary embodiment, the slower correction of voltage spikes by means of the control circuit begins before the fast, dynamic correction by means of the combination consisting of the voltage limitation element, the reference voltage source and the capacitor. As a result, the voltage spikes are corrected more safely and reliably.

BRIEF DESCRIPTION OF THE DRAWINGS

Exemplary embodiments of the invention are explained in greater detail with the aid of the drawings and the following description. In the drawings.

DETAILED DESCRIPTION

Figure 1:
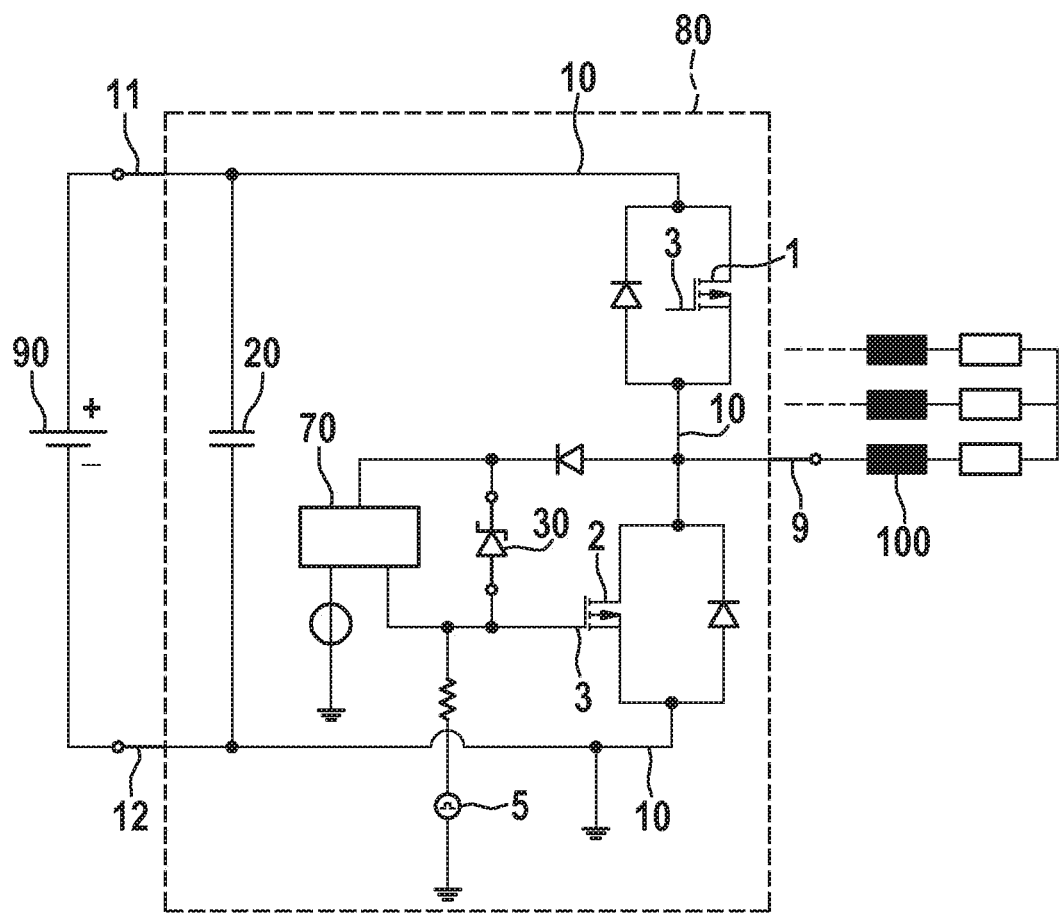
FIG. 1 shows an inverter circuit 80 of the prior art in a state where said circuit is connected to an energy store 90 and a load 100.
Figure 2:
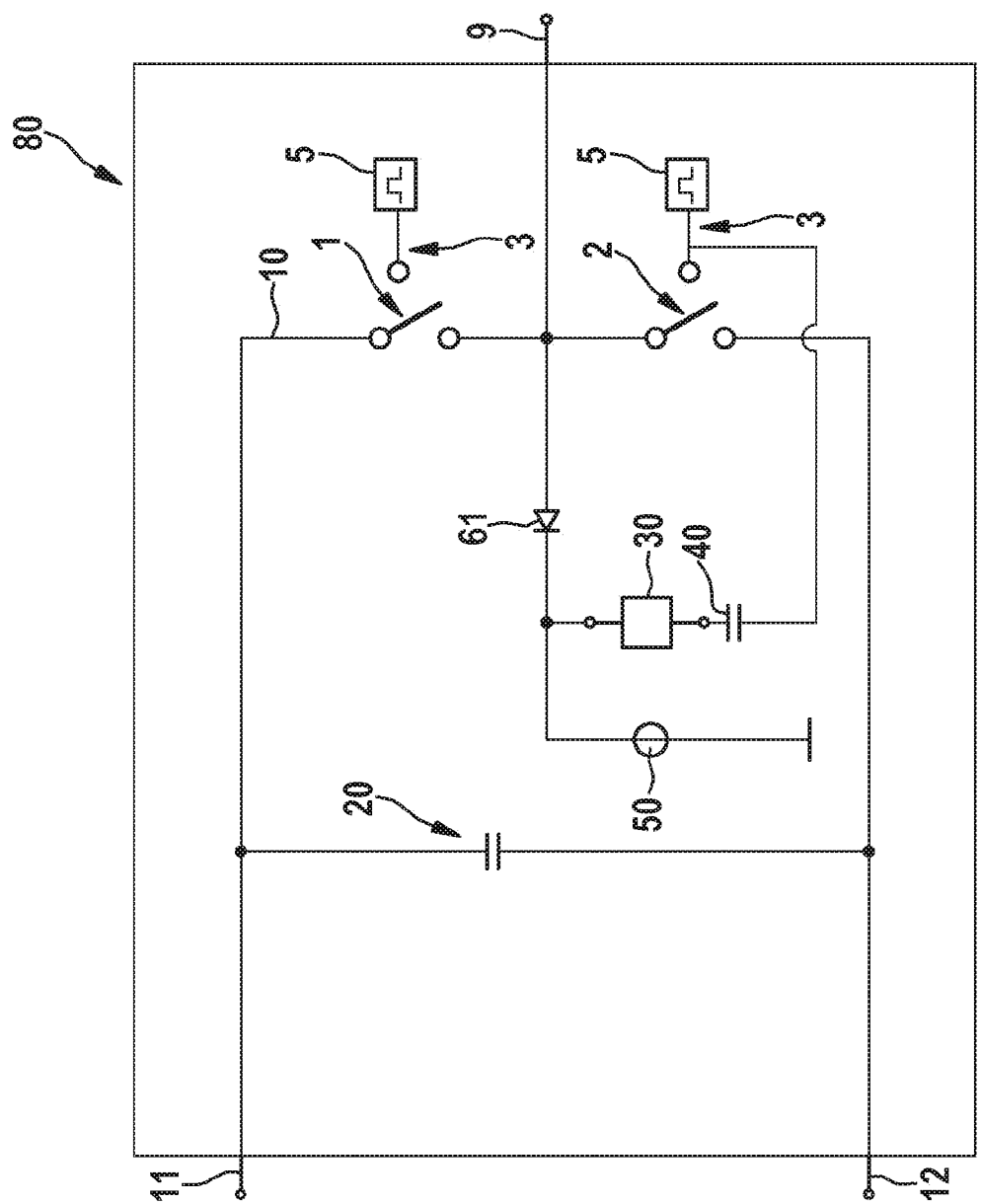
FIG. 2 shows a first exemplary embodiment of an inverter circuit according to the invention without a control circuit.

A first exemplary embodiment of an inverter circuit 80 according to the invention without a control circuit 70 is shown in FIG. 2. The design of the inverter circuit 80 in this exemplary embodiment is with regard to essential components identical to the inverter circuit 80 of the prior art depicted in FIG. 1, said inverter circuit 80 being depicted in a state where it is connected to an energy store 90 and a load 100. The components in FIG. 2 that are identically denoted therefore correspond to those of the example shown in FIG. 1 of an inverter circuit 80 according to the prior art or, respectively, according to that which was previously described. In this first exemplary embodiment, the inverter circuit 80 comprises a capacitor 40, which is disposed in the electrically-conductive connection between the voltage limitation element 30 and the control connection 3 of the second switching means 2. Expressed in other words, the capacitor 40 is disposed in the electrically-conductive connection between the second connection of the voltage limitation element 30 and the control connection 3 of the second switching means 2. The inverter circuit 80 in this first exemplary embodiment furthermore comprises purely by way of example a reference voltage source 50 which is electrically-conductively connected to the first connection of the voltage limitation element 30. The second pole of the reference voltage source 50, which pole is connected to the first connection of the voltage limitation element 30, is connected purely by way of example to the ground potential in this first exemplary embodiment. Said second pole may, however, also be connected to any other potential. The pulse generators 5 connected to the control connections 3 of the first and second switching means 1, 2 are each designed such that the respective switching means 1, 2 to which they are connected are to be opened or, respectively, closed according to a clock pulse or pattern predefined for the respective switching means 1, 2. The electrical path 10 connects the first and the second switching means 1, 2 to the inputs 11, 12 of the inverter circuit 80.

The first exemplary embodiment of an inventive inverter circuit 80 depicted in FIG. 2 furthermore comprises an optional first diode 61, which is arranged in the electrically-conductive connection between the first connection of the voltage limitation element 30 and the electrical path 10. In this first exemplary embodiment, the anode of the first diode 61 is electrically-conductively connected to the electrical path 10, whereas the cathode of the first diode 61 is electrically-conductively connected to the first connection of the voltage limitation element 30. The first diode 61 prevents a reference voltage from the reference voltage source 50 from being passed on to the output 9. Inventive inverter circuits 80 can, however, also be implemented, in which the reference voltage generated by the reference voltage source 50 is prevented from be passed on by other components or, respectively, in a completely different manner.

The voltage limitation element 30 has the feature of being able to provide a very high resistance value up until a breakdown voltage characteristic for the voltage limitation element 30 has been exceeded, wherein the voltage limitation element 30 becomes electrically conductive, i.e. low-resistant, after the characteristic breakdown voltage has been exceeded. In this first exemplary embodiment, the equation Ur=Uc+Uspb applies to the reference voltage Ur which is provided by the reference voltage source 50, wherein Uc corresponds to the voltage at the capacitor 40 in the fully charged state and Uspb corresponds to the breakdown voltage of the voltage limitation element 30. Expressed in other words, the reference voltage source 50 provides purely by way of example a reference voltage Ur in this first exemplary embodiment, said reference voltage Ur dropping across the voltage limitation element 30 and the capacitor 40. If the capacitor is fully charged, precisely the breakdown voltage Uspb drops across the voltage limitation element 30 due to the selection of the magnitude of the reference voltage Ur which is adapted to the capacitor 40 and the voltage limitation element 30. A voltage spike or electrical surge occurring in the electrical path 10 then leads directly to the breakdown of the voltage limitation element 30. This in turn leads to the voltage being passed on via the voltage limitation element 30 to the control connection 3 of the second switching means 2, which then closes so that the voltage spike is degraded in the electrical path 10. The first and the second switching means 1, 2 can be arbitrarily designed, for example, as IGBTs, as semiconductor valves, as MOSFETs or as completely different switching means 1, 2. Furthermore, inverter circuits 80 according to the invention can also be designed such that the reference voltage Ur provided by the reference voltage source 50 is configured differently in said circuits; for example in such a manner that only certain voltage spikes of a predetermined strength lead to a breakdown of the voltage limitation element 30. In addition, the voltage limitation element 30 can also be connected in series to further components, across which the reference voltage Ur provided by the reference voltage source 50 drops and to which the reference voltage Ur is adapted such that precisely the breakdown voltage Uspb or another predetermined voltage falls across the voltage limitation element 30.

Figure 3:
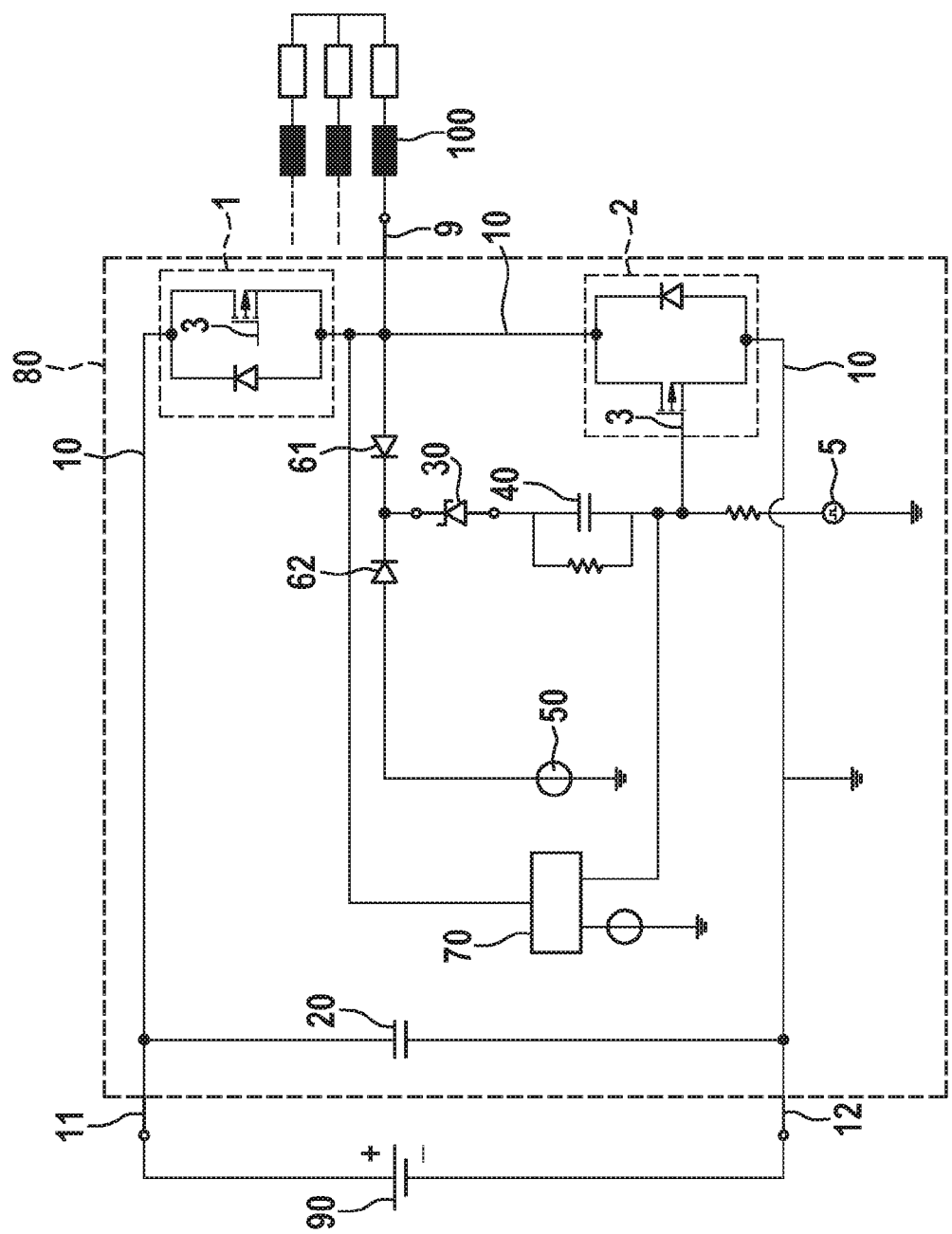
FIG. 3 shows a second exemplary embodiment of an inverter circuit according to the invention.

FIG. 3 shows a second exemplary embodiment of an inventive inverter circuit 80 in the state where it is electrically-conductively connected to a load 100 and an energy store 90. The second exemplary embodiment is identical in the essential components thereof to the first exemplary embodiment shown in FIG. 2 and previously described, so that the identically denoted components in FIG. 3 correspond to the components depicted in FIG. 2 and FIG. 1 and previously described. In the second exemplary embodiment, the first and the second switching means 1, 2 are designed purely by way of example as semiconductor valves. In this second exemplary embodiment, the inverter circuit 80 further comprises a second diode 62 which is arranged in the electrically-conductive connection between the reference voltage source 50 and the first connection of the voltage limitation element 30. Expressed in other words, the inverter circuit 80 in this second exemplary embodiment comprises purely by way of example a second diode 62, the anode of which is electrically-conductively connected to a pole of the reference voltage source 50, whereas the cathode of the second diode 62 is electrically-conductively connected to the cathode of the first diode 61 as well as to the cathode of the voltage limitation element 30 designed purely by way of example as a Zener diode 30 in this second exemplary embodiment. In FIG. 3, the second exemplary embodiment of an inverter circuit 80 according to the invention is connected purely by way of example to an energy store 90 which does not belong to the inverter circuit 80. The input 12 of the inverter circuit 80, which can be connected to the negative pole of the energy store 90 or, respectively, which is connected to said negative pole in this second exemplary embodiment, is connected purely by way of example to the ground potential in this second exemplary embodiment. In addition, a resistor is connected parallel to the capacitor 40 in this second exemplary embodiment. The second exemplary embodiment of the inverter circuit 80 furthermore comprises a control circuit 70, which is described in greater detail with regard to FIG. 4.

Figure 4:
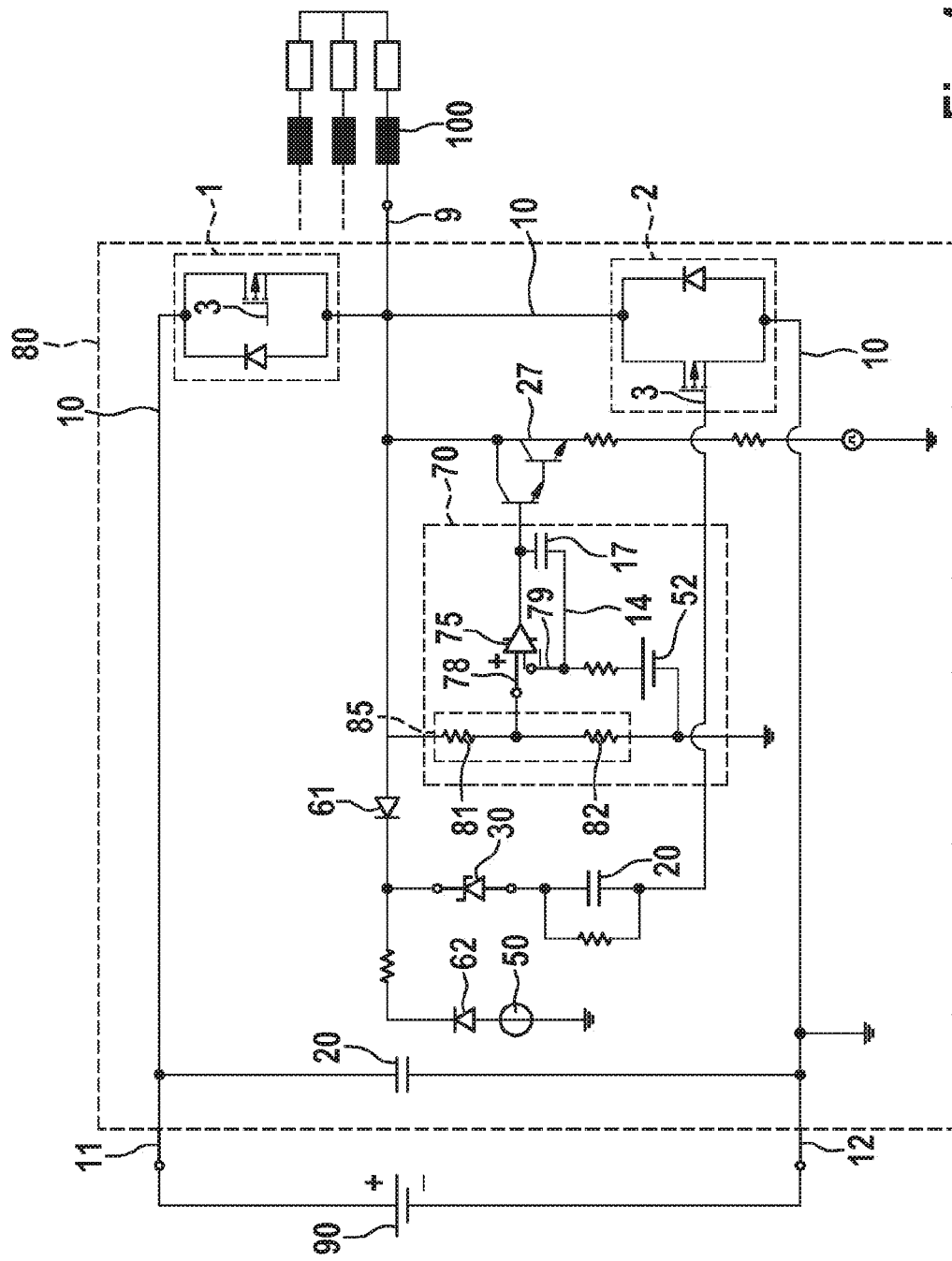
FIG. 4 shows a third exemplary embodiment of an inverter circuit according to the invention that comprises a control circuit according to the invention.

A third exemplary embodiment of an inventive inverter circuit 80 comprising a control circuit 70 according to the invention is depicted in FIG. 4. The third exemplary embodiment of an inventive inverter circuit depicted in FIG. 4 relates substantially to the second exemplary embodiment of an inverter circuit 80 depicted in FIG. 3. The identically denoted components of the third exemplary embodiment depicted in FIG. 4 therefore correspond to those of the exemplary embodiment depicted in FIG. 3 as well as to the second exemplary embodiment previously described. In this third exemplary embodiment, the inverter circuit comprises purely by way of example a control circuit 70 which comprises an input and an output electrically-conductively connected to the control connection 3 of the second switching means 2, wherein the input of the control circuit 70 is electrically-conductively connected to the electrically-conductive connection between the electrical path 10 and the first connection of the voltage limitation element 30, i.e. of the Zener diode 30 in this third exemplary embodiment. Inventive inverter circuits 80 comprising control circuits 70 can however be designed such that the input of the control circuit 70 thereof is directly connected to the electrical path 10 in an electrically-conductive manner. In this third exemplary embodiment, the input of the control circuit 70 is, purely by way of example, electrically-conductively connected to a voltage divider circuit 85 formed from two resistors 81, 82 connected in series to one another. This voltage divider circuit 85 connected via the input of the control circuit 70 to the electrical path 10 is, in turn, connected to a feedback operational amplifier 75 which is comprised by the control circuit 70. The output of the operational amplifier 75 is electrically-conductively connected to the output of the control circuit 70. The connection between the voltage divider circuit 85 and the operational amplifier 75 results via the non-inverting input 78 of said operational amplifier, which input is electrically-conductively connected to the voltage divider circuit 85 between the resistors 81, 82 of said voltage divider circuit 85. A further capacitor 17 is disposed in the feedback branch 14 of the operational amplifier 75 in this third exemplary embodiment. In other words, the operational amplifier 75 which is fed-back via the further capacitor 17 functions purely by way of example as an integrator or, respectively, as an integrating amplifier in this third exemplary embodiment.

In this third exemplary embodiment, the inverting input 79 of the feedback operational amplifier 75 is electrically-conductively connected to a pole of a further voltage source 52, wherein a further resistor is disposed purely by way of example between the operational amplifier 75 and the further voltage source 52 or, respectively, in the electrical connection connecting these two last mentioned elements. The pole of the further voltage source 52 not connected to the inverting input 79 is electrically-conductively connected purely by way of example to the ground potential in this third exemplary embodiment. The output of the control circuit 70 is electrically-conductively connected purely by way of example via a Darlington circuit 27 to the control connection 3 of the second switching means 2 in this third exemplary embodiment. In so doing, a further resistor lies purely by way of example in the electrically-conductive connection between the Darlington circuit 27 and the control connection 3 of the second switching means 2. In this third exemplary embodiment, the regulator voltage $U_{regler}$—the control circuit 70 inducing an opening of the second switching means 2 upon said regulator voltage being applied to the input of said control circuit 70—has a smaller magnitude than the reference voltage Ur provided by the reference voltage source 50.

If a voltage spike or, respectively, an overvoltage is applied to the output 9 of the inverter circuit 80 or, respectively, between the first and the second switching means 1, 2 in the electrical path 10, said voltage spike or, respectively, overvoltage is also applied to the input of the control circuit 70. The voltage applied to the non-inverting input 78 is reduced by a factor which ensues from the ratio of the resistance 82 to the sum of the resistances 81 and 82. The further voltage source 52 provides a voltage at the inverting input 79. If the voltage applied to the non-inverting input 78 of the operational amplifier 75 exceeds the voltage provided by the further voltage source 52, the difference is then integrated from these voltages by the feedback operational amplifier 75 and emitted at the output of said feedback operational amplifier 75, which leads to an amplification or, respectively, opening of the Darlington circuit 27 at the output of the control circuit 70. This in turn effects an opening of the second switching means 2 via the control connection 3 of the second switching means 2, which leads to a degradation of the voltage spike or, respectively, the overvoltage at the electrical path 10.

The invention claimed is:

1. An inverter circuit (80), comprising:
   a first switch (1) and a second switch (2) which are connected, in an electrical path (10), in series to one another and parallel to a DC link capacitor (20) and control connections (3) thereof which are each connected to a pulse control device (5);
   an output (9) and two inputs (11, 12) which are each electrically-conductively connected to a pole of the DC link capacitor (20) and are connected to a pole of an energy store;
   a voltage limitation element (30) which is electrically-conductively connected to the electrical path (10) by a first connection between the first switch (1) and the second switch (2) and to the control connection (3) of the second switch (2) by a second connection;
   characterized in that
   a capacitor (40) is arranged in the electrically-conductive connection between the voltage limitation element (30) and the control connection (3) of the second switch (2), and a reference voltage source (50) is electrically-conductively connected to the first connection of said voltage limitation element (30);
   wherein the equation Ur=Uc+Uspb applies to the reference voltage Ur which is provided by the reference voltage source (50), wherein Uc corresponds to the voltage at the capacitor (40) in the fully charged state, and Uspb corresponds to the breakdown voltage of the voltage limitation element (30).

2. The inverter circuit (80) according to claim 1, further comprising a first diode (61) which is disposed in the electrically-conductive connection between the first connection of the voltage limitation element (30) and the electrical path (10).

3. The inverter circuit (80) according claim 1, further comprising a second diode (62) which is disposed in the electrically-conductive connection between the reference voltage source (50) and the first connection of the voltage limitation element (30).

4. The inverter circuit (80) according to claim 1, wherein the voltage limitation element (30) is a Zener diode (30).

5. The inverter circuit (80) according to claim 1, further comprising a control circuit (70) which has an input and an output which is electrically-conductively connected to the control connection (3) of the second switch (2), wherein the input of the control circuit (70) is electrically-conductively connected to the electrically-conductive connection between the electrical path (10) and the first connection of the voltage limitation element (30).

6. The inverter circuit (80) according to claim 5, wherein the input of the control circuit (70) is electrically-conductively connected to a voltage divider circuit (85) formed by two resistors (81, 82) connected in series to one another.

7. The inverter circuit (80) according to claim 6, wherein the control circuit (70) includes a feedback operational amplifier (75), an output of which is electrically-conductively connected to the output of said control circuit (70), a non-inverting input (78) of which is electrically-conductively connected to the voltage divider circuit (85) between the resistors (81, 82) of said voltage divider circuit (85), and in a feedback branch (14) of which a further capacitor (17) is disposed.

8. The inverter circuit (80) according to claim 7, wherein the inverting input (79) of the feedback operational amplifier (75) is electrically-conductively connected to a pole of a further voltage source (52).

9. The inverter circuit (80) according to claim 5, wherein the output of the control circuit (70) is electrically-conductively connected to the control connection (3) of the second switch (2) via a Darlington circuit (27).

10. The inverter circuit (80) according to claim 5, wherein a regulator voltage $U_{regler}$—the control circuit (70) inducing an opening of the second switch (2) upon said regulator voltage $U_{regler}$ being applied to the input of said control circuit (70)—has a smaller magnitude than a reference voltage Ur provided by the reference voltage source (50).

* * * * *